United States Patent
Endo et al.

(10) Patent No.: US 10,859,600 B2
(45) Date of Patent: Dec. 8, 2020

(54) CURRENT MEASURING DEVICE

(71) Applicant: KOA CORPORATION, Ina (JP)

(72) Inventors: Tamotsu Endo, Nagano (JP); Ryo Osawa, Nagano (JP)

(73) Assignee: KOA CORPORATION, Nagano (JP)

( * ) Notice: Subject to any disclaimer, the term of this patent is extended or adjusted under 35 U.S.C. 154(b) by 96 days.

(21) Appl. No.: 16/317,437

(22) PCT Filed: Jun. 7, 2017

(86) PCT No.: PCT/JP2017/021052
§ 371 (c)(1),
(2) Date: Jan. 11, 2019

(87) PCT Pub. No.: WO2018/012150
PCT Pub. Date: Jan. 18, 2018

(65) Prior Publication Data
US 2019/0324058 A1  Oct. 24, 2019

(30) Foreign Application Priority Data
Jul. 13, 2016  (JP) .................................. 2016-138468

(51) Int. Cl.
*G01R 1/20* (2006.01)
*G01R 31/28* (2006.01)

(52) U.S. Cl.
CPC ......... *G01R 1/203* (2013.01); *G01R 31/2879* (2013.01)

(58) Field of Classification Search
None
See application file for complete search history.

(56) References Cited

U.S. PATENT DOCUMENTS

| | | | | |
|---|---|---|---|---|
| 4,607,205 A * | 8/1986 | Kito | .................. | H02M 7/53875 318/778 |
| 5,107,204 A * | 4/1992 | Bullock | ............... | G01R 15/146 324/105 |
| 5,675,231 A * | 10/1997 | Becerra | .................. | H02P 29/027 318/400.17 |
| 6,028,426 A * | 2/2000 | Cameron | ............... | G01R 1/203 324/126 |
| 6,791,315 B2 * | 9/2004 | Skerritt | .................. | G01R 19/32 324/126 |
| 6,794,854 B2 * | 9/2004 | Nakatsu | .................... | H01C 1/14 322/17 |
| 2003/0038706 A1 * | 2/2003 | Nakatsu | ................ | H02M 7/003 338/49 |

(Continued)

FOREIGN PATENT DOCUMENTS

| | | | | |
|---|---|---|---|---|
| FR | 2994052 A1 * | 1/2014 | .......... | H05K 7/1432 |
| JP | 2004096848 A | 3/2004 | | |

(Continued)

*Primary Examiner* — Paresh Patel
(74) *Attorney, Agent, or Firm* — Brinks Gilson & Lione

(57) ABSTRACT

Provided is a current measuring device including a first wire member formed of a conductive metal and a second wire member formed of a conductive metal, the second wire member partially including a resistive element metal, in which the first wire member and the second wire member are arranged in parallel with an insulator sandwiched therebetween in a portion where at least the resistive element metal is present.

11 Claims, 8 Drawing Sheets

(56) References Cited

U.S. PATENT DOCUMENTS

| | | | | |
|---|---|---|---|---|
| 2011/0254411 A1* | 10/2011 | Minato | ............... | H02M 7/003 |
| | | | | 310/68 C |
| 2011/0267038 A1 | 11/2011 | Homma et al. | | |
| 2013/0187575 A1* | 7/2013 | Yugou | ................. | H01M 10/48 |
| | | | | 318/139 |
| 2018/0156847 A1 | 6/2018 | Nakamura et al. | | |

FOREIGN PATENT DOCUMENTS

| | | |
|---|---|---|
| JP | 2009229133 A | 10/2009 |
| JP | 2011217463 A | 10/2011 |
| JP | 2013174555 A | 9/2013 |
| WO | WO 2017/002766 A1 | 1/2017 |

\* cited by examiner

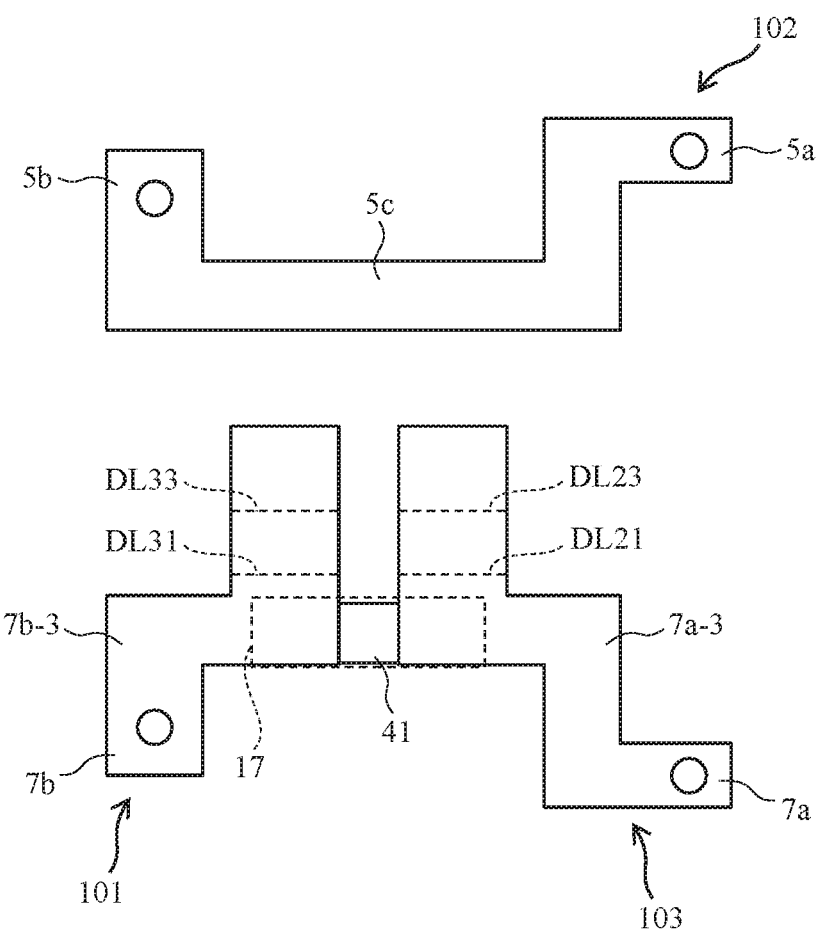

CURRENT MEASURING DEVICE

This application is a 371 application of PCT/JP2017/021052 having an international filing date of Jun. 7, 2017, which claim priority to JP2016-138468 filed Jul. 13, 2016, the entire content of each of which is incorporated herein by reference.

TECHNICAL FIELD

The present invention relates to a current measuring device, and in particular, to a current measuring device for a power module such as an inverter circuit.

BACKGROUND ART

A technique for driving an electric motor using an inverter device is known. An inverter device converts direct current from a power supply (i.e., a battery) into alternating current through switching operations of switching elements therein.

Such an inverter device has mounted thereon semiconductor switching elements and electrolytic capacitors for smoothing current. Examples of such an inverter device include a motor control module of Patent Literature 1. The motor control module includes, on a printed board, a first temperature sensing element for measuring the temperature of the electrolytic capacitors, and a second temperature sensing element for measuring the temperature of the FETs (i.e., the switching elements). In addition, one terminal of one of the electrolytic capacitors is connected to the first temperature sensing element, and one terminal of one of the FETs is connected to the second temperature sensing element. Therefore, the one terminal of the electrolytic capacitor and the first temperature sensing element have substantially the same temperature, and the one terminal of the FET and the second temperature sensing element have substantially the same temperature.

Then, measuring the resistance values of the first and second temperature sensing elements using a temperature measuring circuit can measure the temperatures of the electrolytic capacitors and the FETs. If it is determined from the measured temperatures that the temperatures of the electrolytic capacitors and the FETs are over a predetermined temperature, a control unit of the motor performs control, such as lowering the maximum output of the motor so as to protect the electrolytic capacitors and the FETs.

Meanwhile, Patent Literature 2 discloses a technique for sensing current of an AC motor using a shunt resistor as a current sensing element, with switching elements (e.g., IGBTs and FETs) for performing a switching operation mounted on a substrate and with electrolytic capacitors, which form an LC filter, also mounted on the substrate.

CITATION LIST

Patent Literature

Patent Literature 1: JP 2004-96848 A
Patent Literature 2: JP 2011-217463 A

SUMMARY OF INVENTION

Technical Problem

FIG. 6 is a circuit diagram of an exemplary configuration of a current measuring device X with a typical inverter circuit. As illustrated in FIG. 6, when a motor M is driven with a power supply P, there is a problem of surge voltage generated on wires 105 and 107 in a region from a main circuit capacitor 101 to an inverter bridge 103 due to on or off of switching elements (see FIG. 7).

Reducing surge voltage is important in designing an inverter device and the like in terms of quality. Usually, surge voltage becomes high unless the wire inductance of the wires 105 and 107 is set low.

The present invention is particularly advantageous as a current measuring device used for a power module, such as an inverter circuit. It is an object of the present invention to reduce the inductance of a wire when a shunt resistor is used as a current sensing element.

Solution to Problem

According to an aspect of the present invention, there is provided a current measuring device including a first wire member formed of a conductive metal and a second wire member formed of a conductive metal, the second wire member partially including a resistive element metal, in which the first wire member and the second wire member are arranged in parallel with an insulator sandwiched therebetween in a portion where at least the resistive element metal is present.

Accordingly, when a current sensor including a shunt resistor is disposed on a DC wire path in a region from a capacitor to a power module in an inverter circuit, for example, an area in which a current loop is formed can be reduced. Therefore, the inductance of the wire can be reduced and surge voltage in the power module can be reduced.

Each of the first wire member and the second wire member is preferably in a plate shape, and the first wire member and the second wire member are preferably arranged in parallel such that their wide surfaces face each other.

A portion including the resistive element metal may have a current sensing portion, the current sensing portion incorporating a circuit configured to receive a voltage signal.

The current measuring device preferably further includes a power module having a first terminal and a second terminal for connection to a power supply, the power module being configured to control power, in which the first wire member is connected to the first terminal, and the second wire member is connected to the second terminal.

In such a case, the current measuring device preferably further includes a capacitor, and the first wire member and the second wire member are preferably connected to the capacitor.

The present specification incorporates the disclosure of JP Patent Application No. 2016-138468 that forms the basis of the priority claim of the present application.

Advantageous Effects of Invention

In a current measuring device such as an inverter circuit, the inductance of a wire when a shunt resistor is used as a current sensing element can be reduced.

BRIEF DESCRIPTION OF DRAWINGS

FIG. 1A is a plan view, FIG. 1B is a side view, and FIGS. 1C to 1E are views each illustrating an exemplary cross-sectional structure along line Ib-Ib of FIG. 1B.

FIG. 4 are views each illustrating an exemplary configuration of a current measuring device in accordance with a second embodiment of the present invention; specifically.

FIG. 9C is a development view of FIG. 9A.

DETAILED DESCRIPTION OF THE PREFERRED EMBODIMENTS

In this specification, an inverter (circuit) refers to a power supply circuit that electrically generates AC power from DC power (performs inversion), or a power converter having such a circuit.

Hereinafter, a current measuring device (or a current sensing device) in accordance with an embodiment of the present invention will be described in detail with reference to the drawings.

First Embodiment

First, a first embodiment of the present invention is described below. FIG. 1 are views each illustrating an exemplary configuration of a current measuring device in accordance with this embodiment; specifically, FIG. 1A is a plan view, FIG. 1B is a side view, and FIGS. 1C to 1E are views each illustrating an exemplary cross-sectional structure along line Ib-Ib of FIG. 1B.

Figure 2A:
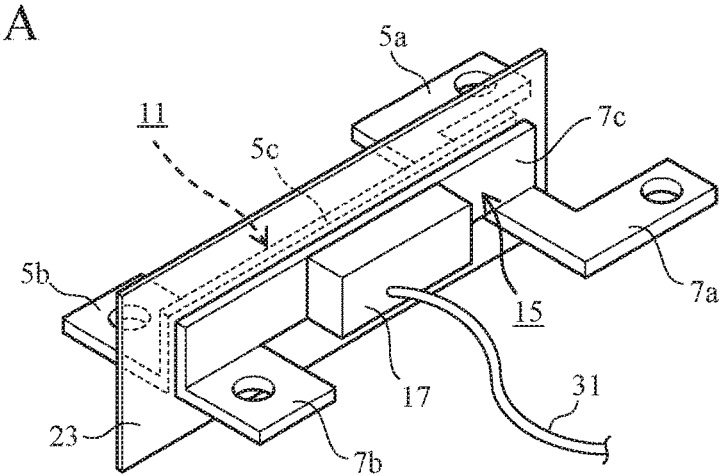
FIG. 2A is a perspective view of an exemplary detailed configuration of a shunt resistor including its peripheral region.
Figure 2B:
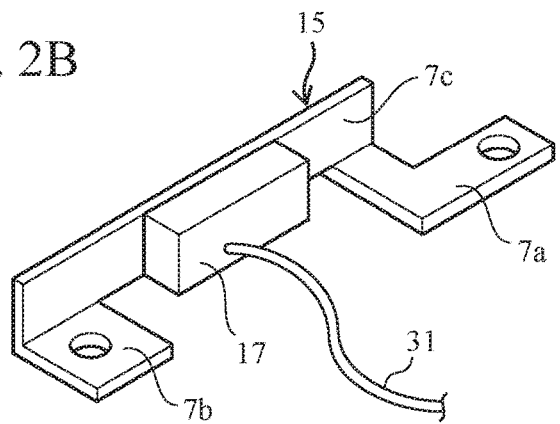
FIGS. 2B to 2D are perspective views each illustrating an exemplary configuration of the shunt resistor.
Figure 2C:
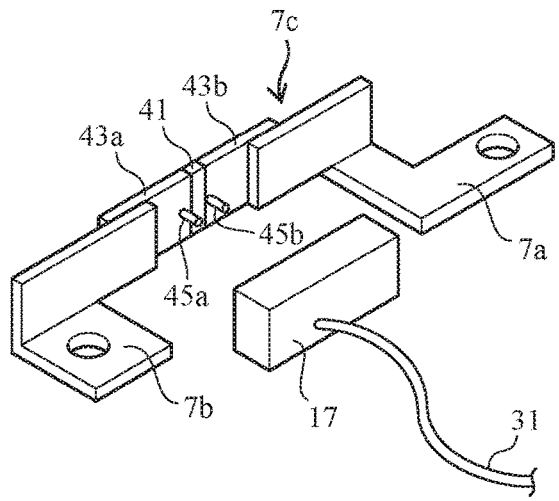
Figure 2D:
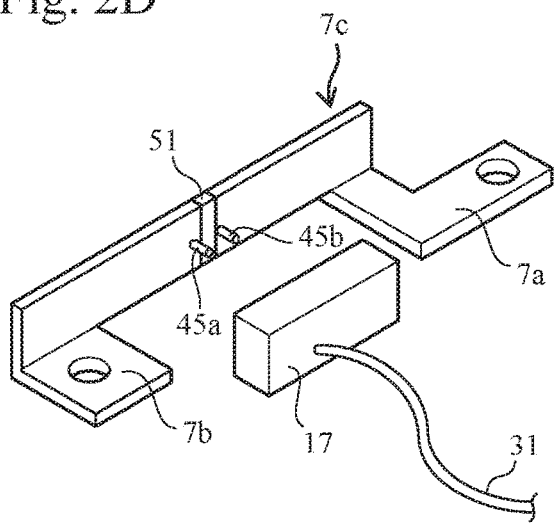

FIG. 2A is a perspective view of an exemplary detailed configuration of a shunt resistor including its peripheral region, and FIGS. 2B to 2D are perspective views each illustrating an exemplary configuration of the shunt resistor.

Figure 1A:
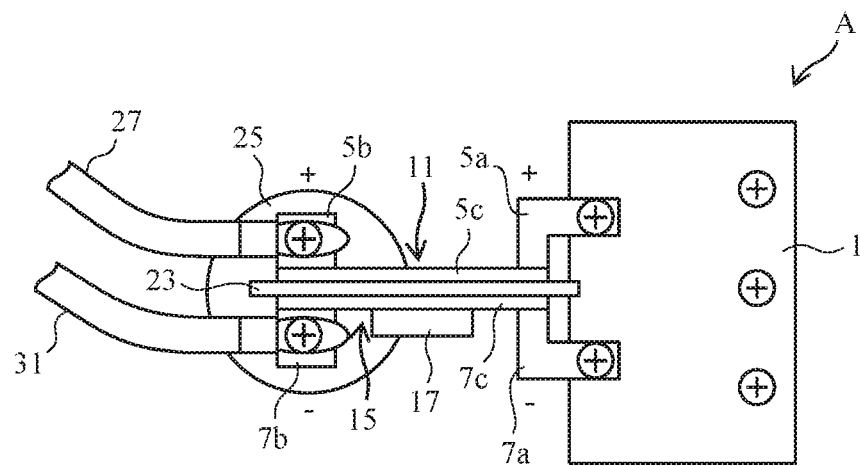
FIGS. 1A through 1E are views each illustrating an exemplary configuration of a current measuring device in accordance with a first embodiment of the present invention; specifically.
Figure 1B:
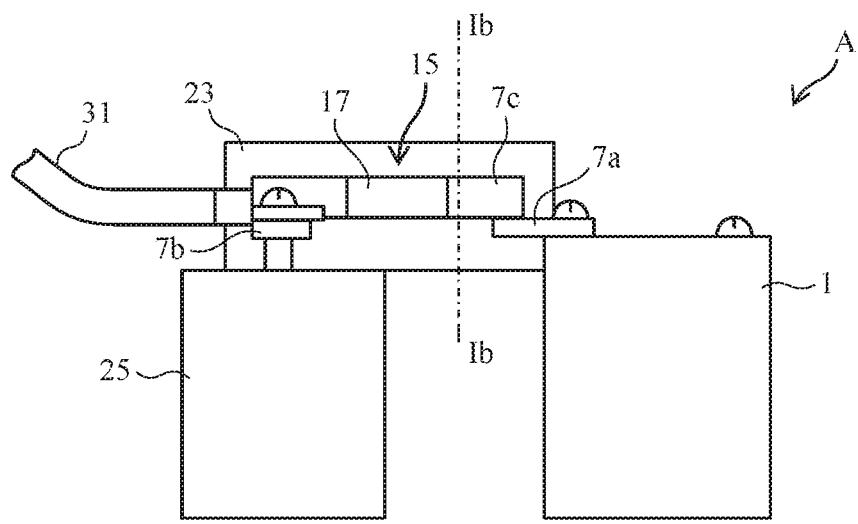
Figure 1C:
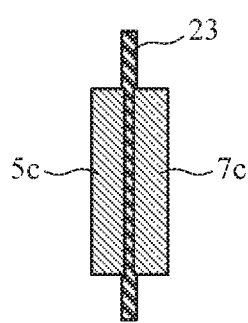
Figure 1D:
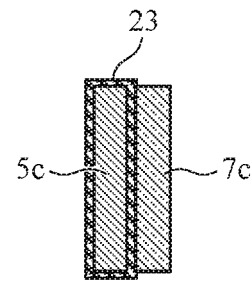
Figure 1E:
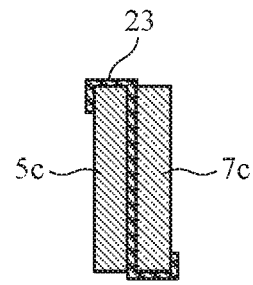

As illustrated in FIGS. 1A and 1B, a current measuring device A in accordance with this embodiment includes, for example, an inverter circuit 1, a first wire member 11 connected to a positive terminal (+) of a power supply (which is described below with reference to FIG. 5) for driving the inverter circuit 1, a second wire member 15 connected to a negative terminal (−) thereof, and a capacitor 25.

The first wire member 11 is formed of a bus bar including a first connection portion 5a, a body 5c, and a second connection portion 5b that are arranged in this order from the positive terminal side of the inverter circuit 1 toward the positive terminal of the capacitor 25. For the first wire member 11 (i.e., the bus bar), a material such as Cu can be used.

The second wire member 15 includes a first connection portion (or electrode terminal) 7a, a body 7c, a shunt-type current sensing portion 17, and a second connection portion (or electrode terminal) 7b that are arranged in this order from the negative terminal side of the inverter circuit 1 toward the negative terminal of the capacitor 25.

Further, the current measuring device A includes a wire 27 connecting the first wire member 11 to the power supply, and a wire 31 connecting the second wire member 15 to the power supply.

In addition, the first wire member 11 and the second wire member 15 are arranged in parallel in proximity to each other with an insulator 23 sandwiched therebetween.

For the insulator 23, an insulating sheet of epoxy resin, silicone, glass fibers, or the like; a thin film such as an oxide film or a nitride film; or a film of epoxy resin, glass, or the like can be used, for example. The first wire member 11 and the second wire member 15 may be spaced apart from each other with a constant gap therebetween (that is, the insulator 23 may be air).

As illustrated in FIG. 1B, portions screwed to the inverter 1 and the capacitor 25, that is, the first connection portion 5a, the second connection portion 5b, the first connection portion 7a, and the second connection portion (or electrode terminal) 7b are arranged horizontally.

Meanwhile, the body 5c and the body 7c that are arranged in parallel have vertical structures such that they are in upright positions with respect to the connection portions. That is, the body 5c and the body 7c are arranged in parallel such that they rise in parallel from the surface of the inverter 1 and the upper surface of the capacitor 25. In addition, the body 5c and the body 7c have their opposed surfaces in proximity to each other, and a gap between the opposed surfaces is narrow. The areas of the opposed surfaces are preferably wide.

In addition, the insulator 23 is preferably provided between the opposed surfaces. In this embodiment, the insulator 23 also has a function of aiding in self-support of the wire members 11 and 15 that are arranged in proximity to each other.

FIGS. 1C to 1E each illustrate an example of the insulator 23. FIG. 1C illustrates an example in which the insulator 23 is wider than the opposed surfaces of the body 5c and the body 7c. Specifically, the insulator 23 lies beyond the opposed surfaces in the top-down direction (in the top-down and right-left directions in FIGS. 1A and 1B). FIG. 1D illustrates a structure obtained by covering the outer periphery of one of the wires, which is the body 5c in this example, with the insulator 23 for insulation purposes. FIG. 1E illustrates a hook-like structure obtained by arranging the insulator 23 between the body 5c and the body 7c such that the upper portion of the body 5c is covered with the insulator 23 and the lower portion of the body 7c is covered with the insulator 23. Since large current flows through the first wire member 11 and the second wire member 15, a structure in which the opposed surfaces have a distance secured therebetween like those illustrated in FIGS. 1C to 1E is preferred to more surely obtain insulation.

As the insulator 23 sandwiched between the body 5c and the body 7c, an insulating sheet with electrical insulating performance can be used, and an insulating sheet with a thickness of less than or equal to 1 mm can be easily processed.

FIG. 2 are views each illustrating a detailed configuration of the second wire member 15. As illustrated in FIG. 2A, the body 5c of the first wire member 11 and the body 7c of the second wire member 15 are arranged and fixed to each other in upright positions with the insulator 23 sandwiched therebetween.

As illustrated in FIG. 2B, the current sensing portion 17 with a voltage signal output circuit, for example, is disposed on the body 7c of the wire portion including a shunt resistor, and the wire 31 for extracting a voltage signal is led out from the current sensing portion 17.

FIGS. 2C and 2D are views each illustrating an exemplary detailed configuration of the body 7c. The configuration illustrated in FIG. 2C includes a shunt resistor having a resistive element 41 and first and second electrodes 43a and 43b welded to the resistive element 41. The resistive element 41 and the electrodes 43a and 43b are welded together with their end surfaces butt-joined together. The electrodes 43a and 43b of the shunt resistor are connected to the first connection portion 7a and the second connection portion 7b. The connection can be formed using laser beam welding or electron beam welding or using a screw mechanism, for example.

For the resistive element 41, a resistive material, such as a Cu—Ni, Ni—Cr, or Cu—Mn-based material, can be used. For the electrode 43a, the electrode 43b, the first connection portion 7a, and the second connection portion 7b, a material such as Cu can be used.

Voltage sensing terminals 45a and 45b formed in upright positions on the first and second electrodes 43a and 43b, respectively, are connected to an output circuit arranged in the current sensing portion 17, and signals are extracted through the extraction wire 31. The current sensing portion 17 incorporates an amplifier circuit, an A/D converter circuit, a microcomputer, and the like as appropriate. The current sensing portion is mounted only on a surface of the second wire member 15 on the side opposite to a surface facing the first wire member 11. Therefore, the first wire member 11 and the second wire member 15 can be advantageously arranged in more proximity to each other.

FIG. 2D illustrates another exemplary structure of the body 7c. In this example, the body 7c includes a resistive element 51. The resistive element 51 is a Cu—Ni-based resistive material like the resistive element 41. An upright portion forming a part of the body 7c that is integrally formed with the first connection portion 7a is connected to the resistive element 51. In addition, an upright portion forming a part of the body 7c that is integrally formed with the second connection portion 7b is connected to the resistive element 51. The connections can be formed using electron beam welding, laser beam welding, cladding, or brazing with metallic nano paste, for example.

This structure is advantageous as the first wire member 11 and the second wire member 15 can be arranged in parallel in more proximity to each other. Although the current sensing portion 17 is disposed only on the second wire member 15, the current sensing portion 17 may be disposed only on the first wire member 11 or on each of the first and second wire members.

Figure 3:
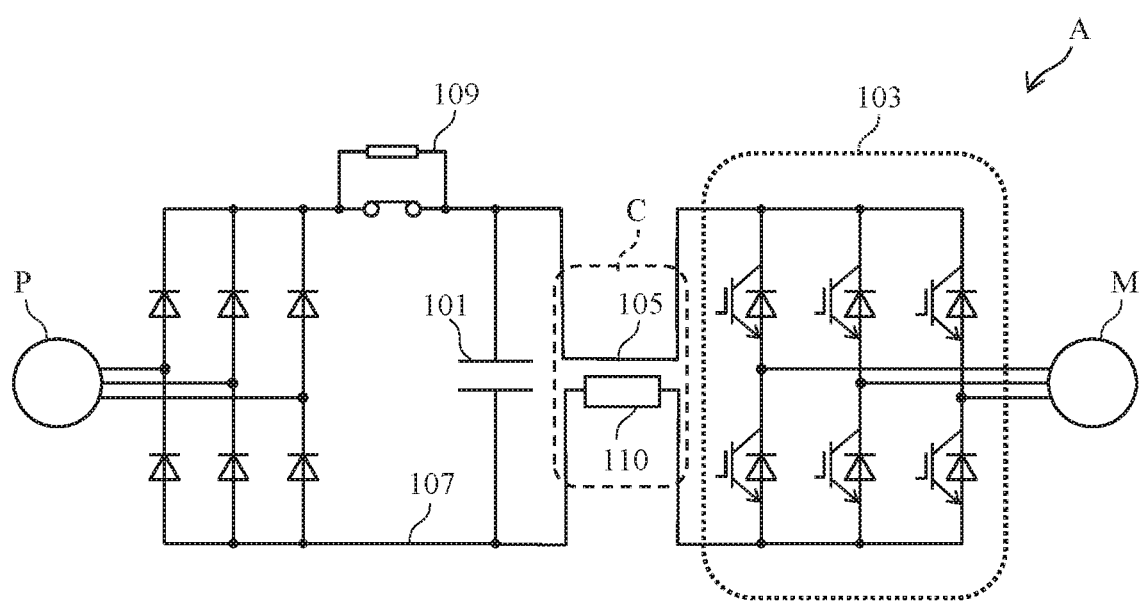
FIG. 3 is a circuit diagram illustrating an exemplary configuration of a current measuring device with an inverter circuit in accordance with this embodiment.

FIG. 3 is a circuit diagram illustrating an exemplary configuration of the current measuring device A with the inverter circuit in accordance with this embodiment. With the aforementioned configuration, a portion C indicated by the dashed line can be made shorter as the first wire member 11 and the second wire member 15 can be arranged in more proximity to each other.

Therefore, when a current sensor including a shunt resistor is disposed on a DC wire path in a region from a capacitor to a power module in an inverter circuit, an area in which a current loop is formed can be reduced. Thus, the inductance of the wire can be reduced and surge voltage in the power module can be suppressed.

Second Embodiment

Figure 4A:
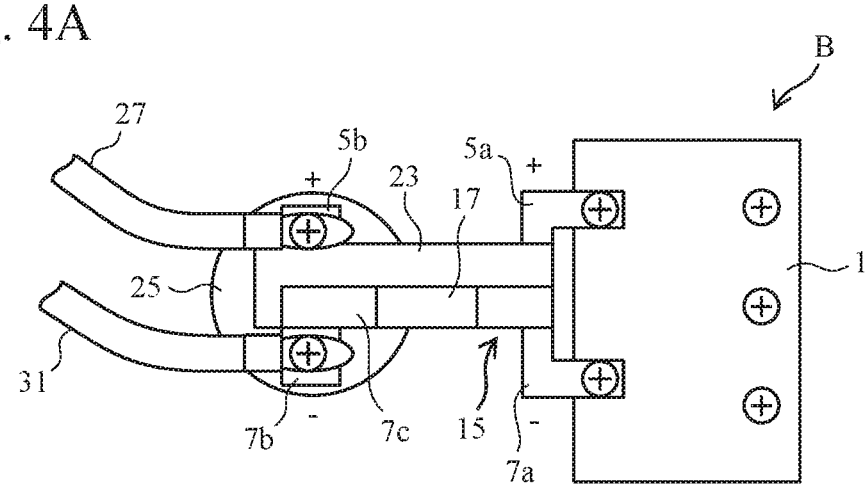
FIG. 4A is a plan view and FIG. 4B is a side view.
Figure 4B:
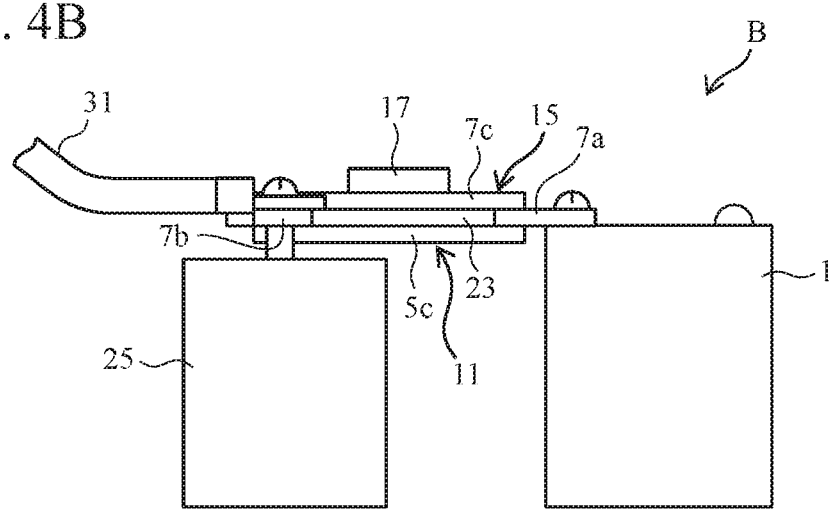

Next, a second embodiment of the present invention will be described. FIG. 4 are views each illustrating an exemplary configuration of a current measuring device B in accordance with an embodiment of the present invention; specifically, FIG. 4A is a plan view and FIG. 4B is a side view.

Figure 5:
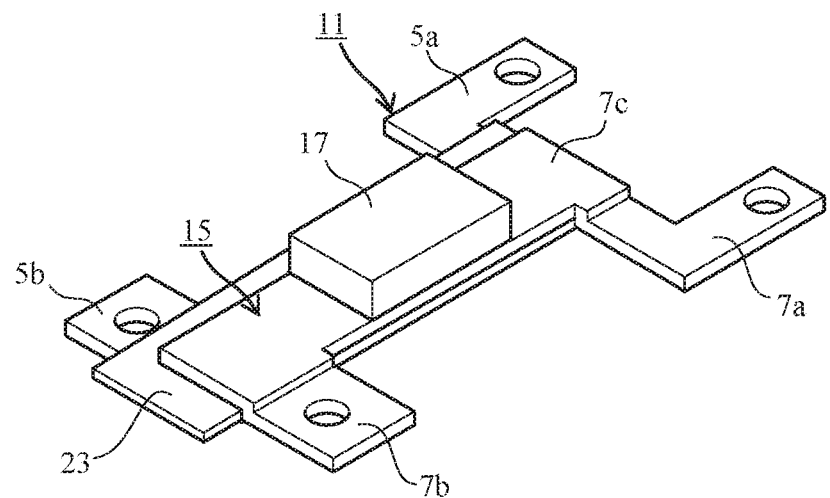
FIG. 5 is a perspective view of an exemplary detailed configuration of a shunt resistor including its peripheral region, which is a view corresponding to FIG. 2A.
Figure 6:
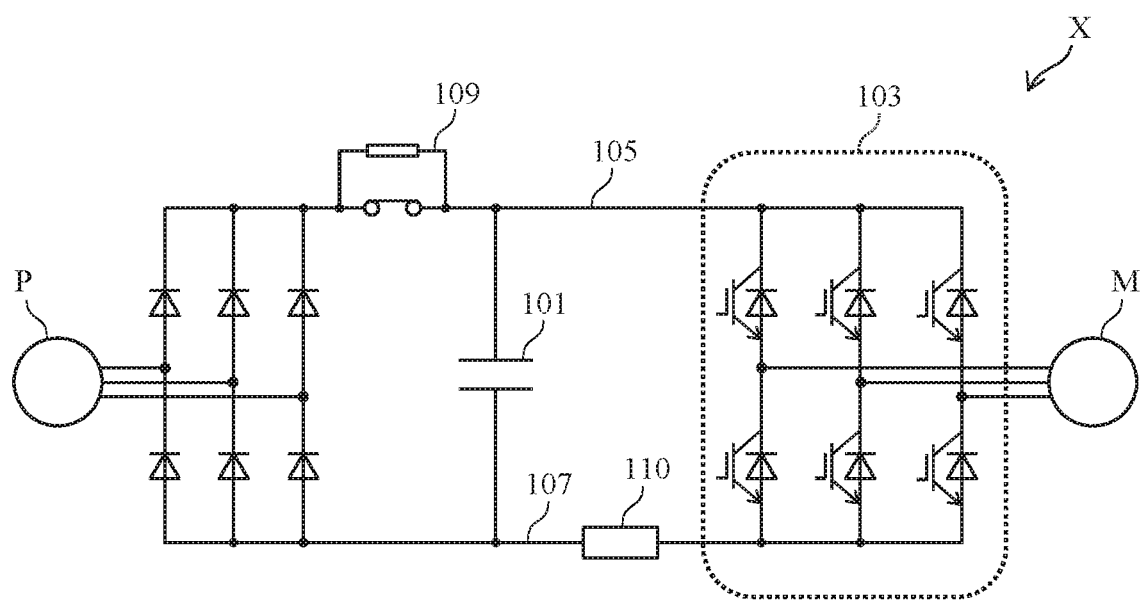
FIG. 6 is a circuit diagram illustrating an exemplary configuration of a current measuring device with a typical inverter circuit.
Figure 7:
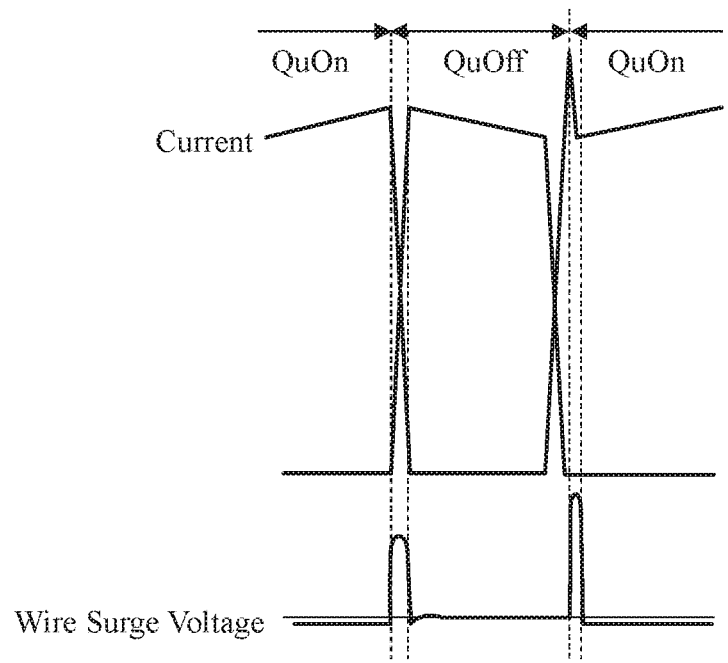
FIG. 7 is a view in which surge voltage is generated.

FIG. 5 is a perspective view corresponding to FIG. 2A.

The second embodiment differs from the first embodiment in that in the second embodiment, wires are arranged such that they face each other in the horizontal direction with respect to the substrate surface. As illustrated in the drawing, the body 5c (not illustrated) of the first wire member 11 and the body 7c of the second wire member 15 are arranged such that they face each other while overlapping one on top of the other in the vertical direction, with the insulator 23 sandwiched therebetween.

According to such a configuration, when a current sensor including a shunt resistor is disposed on a DC wire path in a region from a capacitor to a power module in an inverter circuit, an area in which a current loop is formed can be reduced. Thus, the inductance of the wire can be reduced and surge voltage in the power module can be suppressed.

In this embodiment, the insulator 23 also has a function of maintaining a gap between the wire members 5 and 7 that are arranged in proximity to each other one on top of the other.

According to this embodiment, in a current measuring device including an inverter circuit, inductance when a shunt resistor is used as a current sensing element can be reduced.

Third Embodiment

Figure 8:
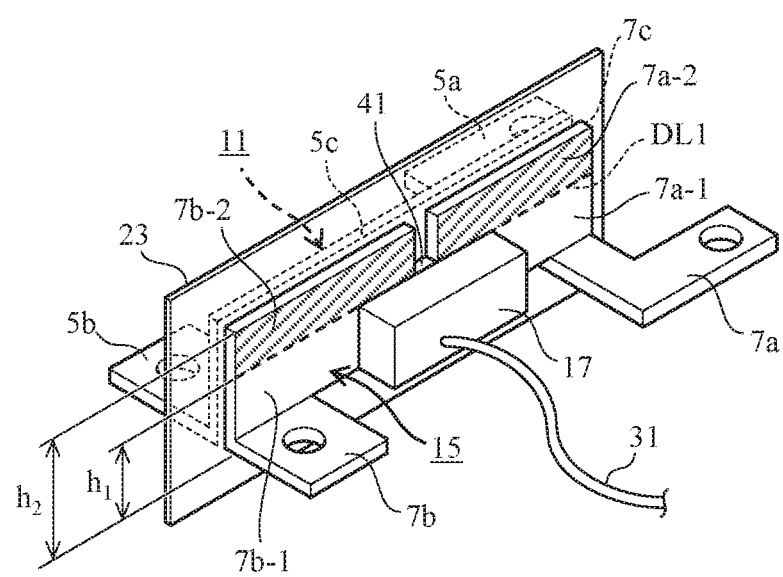
FIG. 8 is a perspective view illustrating an exemplary detailed configuration of a shunt resistor including its peripheral region in accordance with a third embodiment of the present invention, which is a view corresponding to FIG. 2A.

Next, a current measuring device in accordance with a third embodiment of the present invention will be described. FIG. 8 is a perspective view illustrating an exemplary detailed configuration of a shunt resistor including its peripheral region in accordance with the third embodiment of the present invention, which corresponds to FIG. 2A.

More specifically, as can be understood from comparison between FIGS. 2A and 8, in a structure in which the body 5c of the first wire member 11 and the body 7c of the second wire member 15 are arranged one on top of the other in the upright position with the insulator 23 sandwiched therebetween, an area of the opposed regions of the first wire member 11 and the second wire member 15 is made wider than that of the structure illustrated in FIG. 2A. That is, an area of the opposed regions of the wire members that are attached together across the insulator 23 is widened by an amount corresponding to a height h2 minus a height h1 (where h1<h2) of a region illustrated in FIG. 8 (the height h1 corresponds to the opposed regions illustrated in FIG. 2A) (i.e., by an amount of a region above reference symbol DL-1). Therefore, the capacitance value of the bus bars can be increased as indicated in Formula (1) below.

Capacitance value=an area of the opposed regions attached together×the dielectric constant/the gap between the bus bars     (1)

The capacitance value of the bus bars can be calculated from Formula (1). Therefore, appropriately changing the area of the opposed regions that are attached together can design the desired capacitance value.

Alternatively, if an insulator is sandwiched between the bus bars, and the gap between the bus bars (i.e., bus bar gap) is set narrow (i.e., if the thickness of the insulator is made thin), large capacitance components can be secured as is also obvious from the formula indicated above.

As described above, when the bus bars on the positive side and the negative side are attached together, the bus bars can be provided with capacitance (i.e., capacitance of a capacitor). When the current measuring device with the inverter circuit is provided with capacitance of a capacitor, it is possible to exert the effect of reducing surge voltage in the power module when the current measuring device is operated at a fast speed. Consequently, the bus bars can have noise-reducing ability.

As described above, in the current measuring device with the inverter circuit of this embodiment, capacitance formed between the bus bars is increased so that the effect of reducing surge voltage when the current measuring device with the inverter circuit is operated at a fast speed can be exerted.

Fourth Embodiment

Next, a fourth embodiment of the present invention will be described.

Figure 9A:
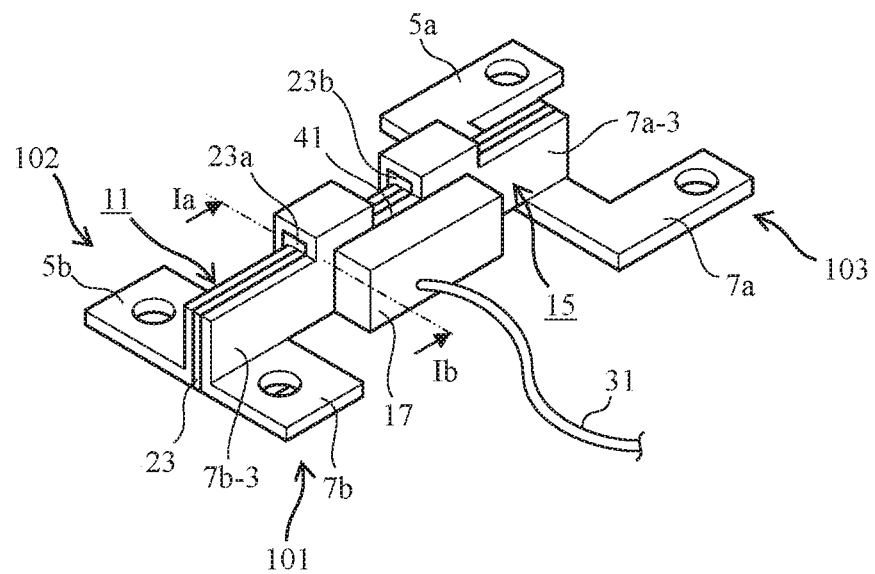
FIG. 9A is a perspective view of an exemplary detailed configuration of a shunt resistor including its peripheral region in accordance with a fourth embodiment of the present invention, which is a view corresponding to FIGS. 2A and 8.
Figure 9B:
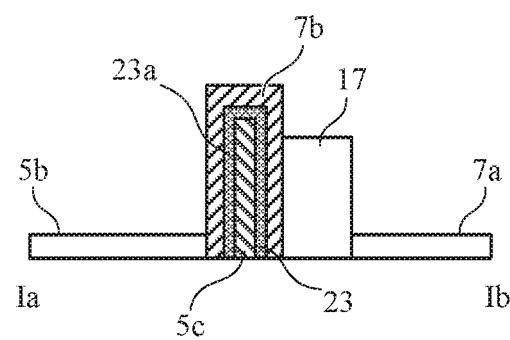
FIG. 9B is a side view of FIG. 9A, and a portion of FIG. 9B along line Ia-Ib of FIG. 9A is a side view.

FIG. 9A is a perspective view of an exemplary detailed configuration of a shunt resistor including its peripheral region in accordance with a fourth embodiment of the present invention, which is a view corresponding to FIGS. 2A and 8. FIG. 9B is a side view of FIG. 9A, and a portion of FIG. 9B along line Ia-Ib of FIG. 9A is a side cross-sectional view. FIG. 9C is a development view of bus bars (i.e., wire members) in FIG. 9A.

As illustrated in FIGS. 9A to 9C, a current sensing device in accordance with a third embodiment of the present invention has a structure in which bus bars 5a and 5b on one side are enveloped by bus bars 7a and 7b on the other side. More specifically, overhung portions of bus bars 101 and 103 in the development view of the bus bars in FIG. 9C are folded back along the dotted line portions DL 21, DL 23, DL 31, and DL 33 so as to envelop the bus bar 102 (FIG. 9B). An insulator 23a for electrical insulation is disposed between the overhung portion of the bus bar 101 and the bus bar 102. In addition, an insulator 23b for electrical insulation is disposed between the overhung portion of the bus bar 103 and the bus bar 102. According to such a configuration, the body 5c of the bus bar 102 can have a structure like a coaxial wire enveloped by the bus bars 101 and 103 as illustrated in FIG. 9B.

Therefore, a reduction in the inductance and an increase in the capacitance can be achieved at the same time.

In the aforementioned embodiments, the configurations and the like illustrated in the accompanying drawings are not limited thereto, and can be changed as appropriate within the range that the advantageous effects of the present invention can be exerted. Although an inverter circuit has been exemplarily described above, the present invention can be applied to a variety of power modules for controlling power that have mounted thereon power semiconductor elements, such as transistors, diodes, and FETs. Besides, the configurations and the like can be changed as appropriate within the spirit and scope of the present invention.

Each configuration of the present invention can be selected or not selected as appropriate, and an invention that includes the selected configuration(s) is encompassed by the present invention.

INDUSTRIAL APPLICABILITY

The present invention is applicable to current sensing devices.

REFERENCE SIGNS LIST

A Current measuring device
1 Inverter circuit
5a First connection portion
5b Second connection portion
5c Body
7a First connection portion (electrode terminal)
7b Second connection portion (electrode terminal)
7c Body
11 First wire member
15 Second wire member
17 Current sensing portion
23 Insulator
25 Capacitor
27 Wire on positive terminal side
31 Wire on negative terminal side All publications, patents, and patent applications cited in this specification are all incorporated by reference into this specification.

What is claimed is:

1. An electrical circuit comprising a current measuring device for measuring direct current flowing through the electrical circuit, the electrical circuit comprising:
   a direct current power source having a first terminal and a second terminal and configured to supply direct-current voltage across the first and second terminals of the direct current power source;
   a load circuit having a first terminal and a second terminal and configured to receive the direct-current voltage from the direct current power source through the first and second terminals of the load;
   a first wire member formed of a conductive metal connected in series between the direct current power source and the load circuit on one of an upstream or downstream side of the electrical circuit, the first wire member having first and second ends and configured to electrically connect, through its first and second ends, the first terminal of the power source and the first terminal of the load circuit to each other; and
   a second wire member formed of a conductive metal connected in series between the direct current power source and the load circuit on the other of the upstream or downstream side of the electrical circuit, the second wire member having first and second ends and configured to electrically connect, through its first and second ends, the second terminal of the power source and the second terminal of the load circuit to each other, the second wire member including an area of a resistive element metal present between the first and second ends of the second wire member so that the conductive metal of the second wire member is segregated into two separate areas along a length of the second wire member;

an electrical insulator formed of a non-fluid material in a thin sheet sandwiched between the first and second wire members without any gap between them to electrically isolate the first and second wire members in such a manner that the first wire member and the second wire member fixedly face each other in parallel with and in close proximity with each other with the electrical insulator between them; and a current measuring device electrically connected to the second wire member at two current sensing probes positioned in the second wire member to measure a voltage drop across the resistive element material.

2. The current measuring device according to claim 1, wherein:

the first wire member is made in form of a flat plate having flat surfaces arranged in a thickness direction of the first wire member:

the second wire member is made in form of a flat plate having flat surfaces arranged in a thickness direction of the second wire member: and one of the flat surfaces of the first wire member and one of the flat surfaces of the second wire member fixedly face each other in parallel with and in close proximity with each other with the electrical insulator between them.

3. The electrical circuit according to claim 1, wherein the current measuring device comprises an electrical circuit configured to receive the voltage drop and calculate the direct current flowing through the electrical circuit.

4. The electrical circuit according to claim 1, wherein the direct current power source comprises a power module configured to convert alternate current into direct current, and the load circuit comprises an inverter circuit configured to switch the direct current from the power module to operate an electrical motor, wherein the first and second wire members are both connected in series between the power module and the inverter circuit, respectively, on the upstream and downstream sides of the electrical circuit.

5. The electrical circuit according to claim 4, further comprising a capacitor connected in parallel with the power module and the inverter circuit on an upstream side of the first and second wire members.

6. The electrical circuit according to claim 1, wherein the electrical insulator comprises an insulating sheet made of epoxy resin, silicone or glass fibers.

7. The electrical circuit according to claim 1, wherein the electrical insulator comprises a thin film made of an oxide film or a nitride film.

8. The electrical circuit according to claim 1, wherein the electrical insulator is of a thickness less than 1 mm.

9. The electrical circuit according to claim 1, wherein the electrical insulator encircles one of the first or second wire member.

10. The electrical circuit according to claim 1, wherein the electrical insulator having two side margins wherein one side margin thereof wraps a side end of the first wire member, and the other side margin thereof wraps a side end of the second wire member.

11. The electrical circuit according to claim 2, wherein the flat surfaces facing each other of the first and second wire members are located in one of two orthogonally arranged planes.

* * * * *